(12) United States Patent
Hur

(10) Patent No.: US 9,123,678 B2
(45) Date of Patent: Sep. 1, 2015

(54) ORGANIC LIGHT EMITTING DIODE DISPLAY

(71) Applicant: Yong-Koo Hur, Yongin (KR)

(72) Inventor: Yong-Koo Hur, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 49 days.

(21) Appl. No.: 13/957,355

(22) Filed: Aug. 1, 2013

(65) Prior Publication Data

US 2014/0117328 A1   May 1, 2014

(30) Foreign Application Priority Data

Oct. 26, 2012   (KR) .................. 10-2012-0119732

(51) Int. Cl.
*H01L 29/08* (2006.01)
*H01L 29/12* (2006.01)
*H01L 27/32* (2006.01)
*H01L 27/12* (2006.01)

(52) U.S. Cl.
CPC ........ *H01L 27/3265* (2013.01); *H01L 27/1255* (2013.01); *H01L 27/3276* (2013.01)

(58) Field of Classification Search
CPC . H01L 27/32; H01L 27/3265; H01L 27/3266; H01L 51/52; H01L 28/40
USPC ................................ 257/71, 59, 40
See application file for complete search history.

(56) References Cited

U.S. PATENT DOCUMENTS

| | | | |
|---|---|---|---|
| 6,351,078 B1 * | 2/2002 | Wang et al. ................ | 315/169.3 |
| 6,544,841 B1 * | 4/2003 | Ciavatti ........................ | 438/254 |
| 8,546,825 B2 * | 10/2013 | Yamazaki et al. ............. | 257/89 |
| 2008/0246026 A1 * | 10/2008 | Kim ................................ | 257/40 |
| 2011/0297941 A1 * | 12/2011 | Zhan et al. ...................... | 257/59 |
| 2012/0127220 A1 * | 5/2012 | Noguchi ....................... | 345/690 |
| 2012/0313100 A1 * | 12/2012 | Liu et al. ......................... | 257/59 |

FOREIGN PATENT DOCUMENTS

| | | |
|---|---|---|
| KR | 10-2008-0085411 A | 9/2008 |
| KR | 10-2012-0056678 A | 6/2012 |

* cited by examiner

*Primary Examiner* — Julio J Maldonado
*Assistant Examiner* — Moazzam Hossain
(74) *Attorney, Agent, or Firm* — Christie, Parker & Hale, LLP

(57) ABSTRACT

An organic light emitting diode display including: a substrate; an organic light emitting diode on the substrate; a first thin film transistor coupled to the organic light emitting diode; and a first capacitor including a first capacitor electrode coupled to a first gate electrode of the first thin film transistor and a second capacitor electrode on the first capacitor electrode. The first capacitor electrode includes a protruding portion not overlapping the second capacitor electrode, and the second capacitor electrode includes a recess portion through which the first capacitor electrode is exposed.

11 Claims, 7 Drawing Sheets

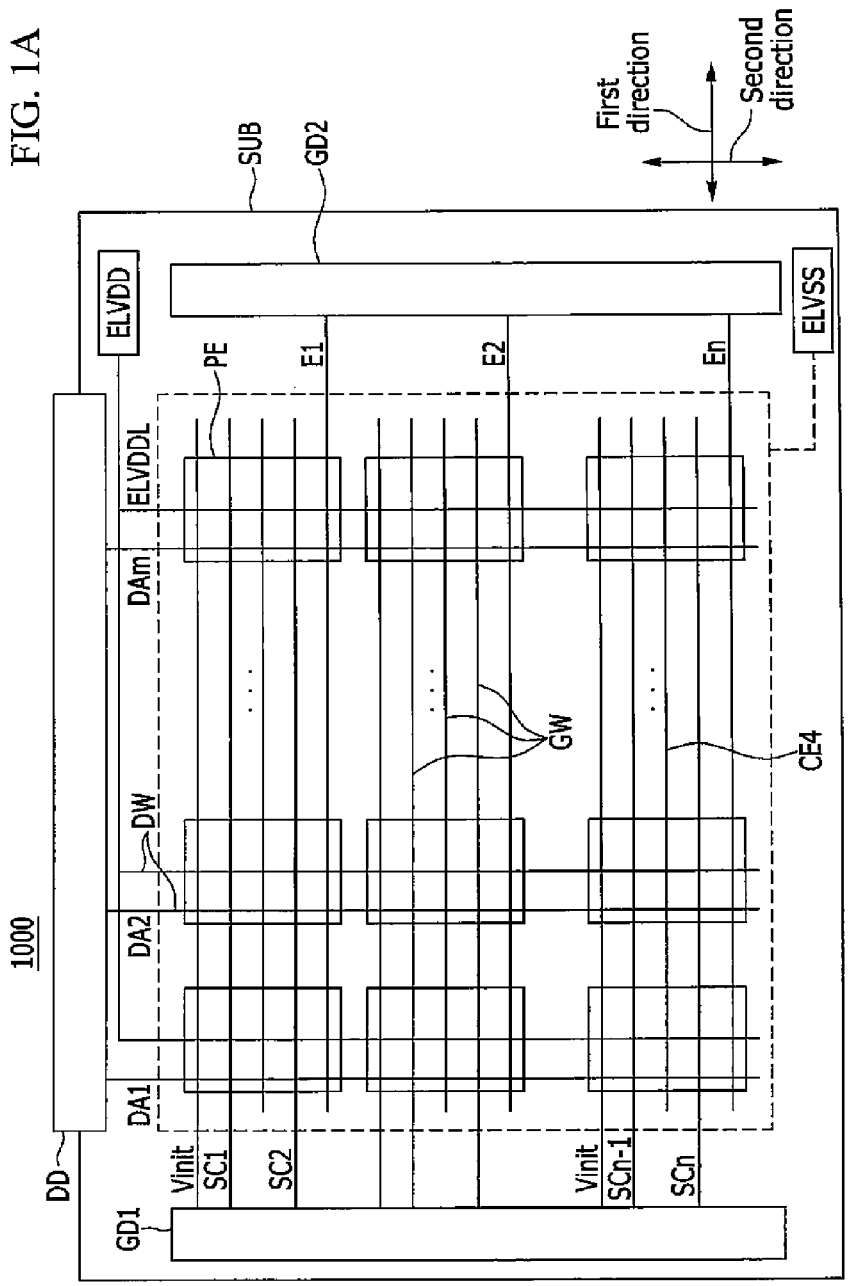

1000

1000

ORGANIC LIGHT EMITTING DIODE DISPLAY

CROSS-REFERENCE TO RELATED APPLICATION

This application claims priority to and the benefit of Korean Patent Application No. 10-2012-0119732 filed in the Korean Intellectual Property Office on Oct. 26, 2012, the entire content of which is incorporated herein by reference.

BACKGROUND

1. Field

Embodiments of the present invention relate generally to an organic light emitting diode display, and more particularly to an organic light emitting diode display including a plurality of thin film transistors and capacitors.

2. Description of Related Art

A display device is a device for displaying an image, and currently, an organic light emitting diode display is receiving attention as one such device.

An organic light emitting diode display has a self-light emitting characteristic so that a separate light source is generally not required, unlike a liquid crystal display, and therefore a thickness and a weight of the organic light emitting diode display may be reduced. Further, an organic light emitting diode display may exhibit high-quality characteristics such as low power source consumption, high luminance, and high reaction speed.

Generally, an organic light emitting diode display may include gate wires positioned on a substrate and extending in one direction, data wires extending in a direction crossing the gate wires, a plurality of thin film transistors and capacitors coupled to the gate wires and the data wires, and an organic light emitting diode coupled to the thin film transistors.

The capacitor may include a pair of electrodes facing each other, and may be formed so that any one electrode of the pair of electrodes includes a protruding pattern in order to compensate a process deviation occurring during a manufacturing process of forming the capacitor.

However, there may be a problem in that an area constituting one pixel may be increased by the protruding pattern, and a load of a current through the capacitor may be increased by allowing any one electrode of a pair of electrodes forming the capacitor to include the protruding pattern.

The above information disclosed in this Background section is only for enhancement of understanding of the background of the described technology and therefore it may contain information that does not form the prior art that is already known in this country to a person of ordinary skill in the art.

SUMMARY

Aspects of embodiments of the present invention provide an organic light emitting diode display in which an area constituting one pixel is reduced and a load of a current through a capacitor is reduced (or minimized).

An exemplary embodiment provides an organic light emitting diode display including: a substrate; an organic light emitting diode on the substrate; a first thin film transistor coupled to the organic light emitting diode; and a first capacitor including a first capacitor electrode coupled to a first gate electrode of the first thin film transistor and a second capacitor electrode on the first capacitor electrode. The first capacitor electrode includes a protruding portion not overlapping the second capacitor electrode, and the second capacitor electrode includes a recess portion through which the first capacitor electrode is exposed.

The protruding portion may protrude in a plate surface direction of the substrate, and the recess portion may be recessed in the plate surface direction of the substrate.

A width of the protruding portion and a width of the recess portion may be substantially the same as each other.

The protruding portion and the recess portion may be on the same imaginary line.

The organic light emitting diode display may further include a connection line extending along the same imaginary line and on the second capacitor electrode to couple the first gate electrode and the first capacitor electrode. The width of the recess portion may be larger than a width of the connection line.

The organic light emitting diode display may further include: a first scan line extending in a first direction on the substrate; a second scan line extending in the first direction to be spaced apart from the first scan line and coupled to the second capacitor electrode; an initialization power source line extending in the first direction to be spaced apart from the second scan line and coupled to the first capacitor electrode; a light emission control line extending in the first direction to be spaced apart from the initialization power source line; a data line extending in a second direction crossing the first direction on the substrate; and a driving power source line extending in the second direction to be spaced apart from the data line.

The second capacitor electrode, the first gate electrode, the first scan line, the second scan line, and the light emission control line may be on the same layer.

The organic light emitting diode display may further include: a second thin film transistor including a second gate electrode coupled to the second scan line and coupling the data line and the first thin film transistor; a third thin film transistor including a third gate electrode coupled to the second scan line and coupling the first thin film transistor and the first gate electrode of the first thin film transistor; a fourth thin film transistor including a fourth gate electrode coupled to the first scan line and coupling the initialization power source line and the first gate electrode; a fifth thin film transistor including a fifth gate electrode coupled to the light emission control line and coupling the driving power source line and the first thin film transistor; and a sixth thin film transistor including a sixth gate electrode coupled to the light emission control line and coupling the first thin film transistor and the organic light emitting diode.

The first gate electrode, the second gate electrode, the third gate electrode, the fourth gate electrode, the fifth gate electrode, and the sixth gate electrode may be on the same layer as the second capacitor electrode, and an active layer of each of the first thin film transistor, the second thin film transistor, the third thin film transistor, the fourth thin film transistor, the fifth thin film transistor, and the sixth thin film transistor may be on the same layer as the first capacitor electrode.

The organic light emitting diode display may further include: a second capacitor including a third capacitor electrode between the active layer of the fourth thin film transistor and the first capacitor electrode to be coupled to the first capacitor electrode, and a fourth capacitor electrode coupled to the driving power source line and on the same layer as the first gate electrode.

The protruding portion may couple the third capacitor electrode and the first capacitor electrode.

The organic light emitting diode may include: a first electrode coupled to the first thin film transistor; an organic emission layer on the first electrode; and a second electrode on the organic emission layer.

According to an exemplary embodiment, there is provided an organic light emitting diode display in which an area constituting one pixel is reduced and a load of a current through a capacitor is reduced (or minimized).

BRIEF DESCRIPTION OF THE DRAWINGS

FIG. 1A is a view illustrating an organic light emitting diode display according to a first embodiment.

DETAILED DESCRIPTION

Figure 1B:
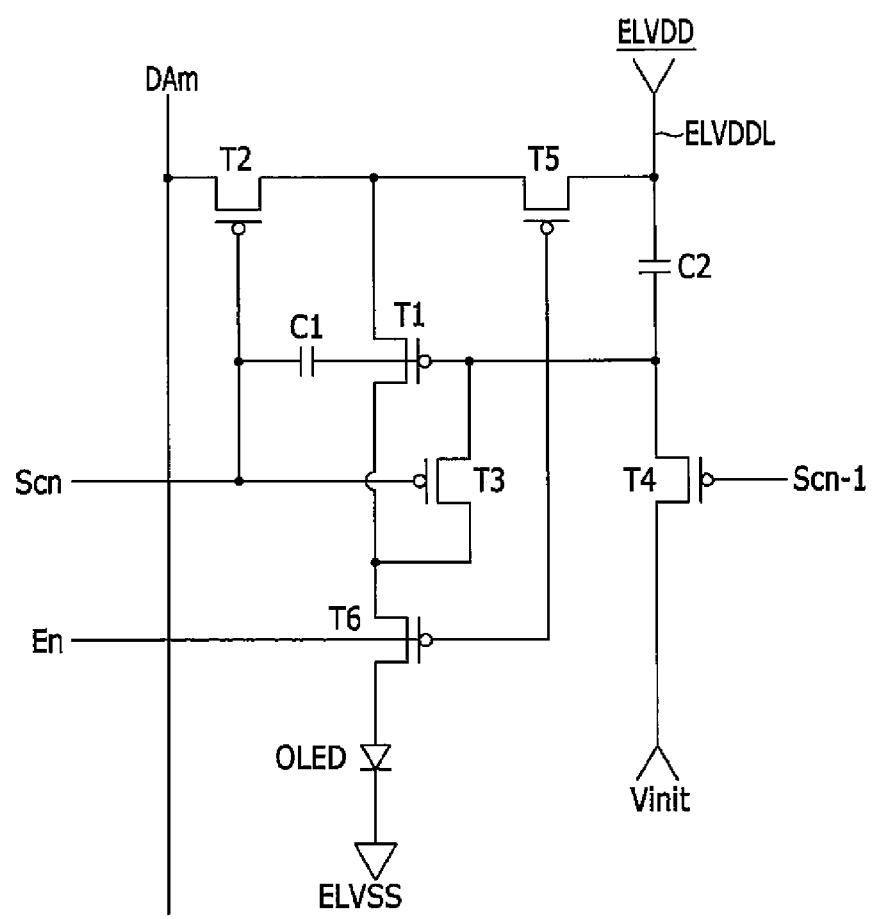
FIG. 1B is a circuit diagram of a pixel of an organic light emitting diode display according to an embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

Further, in exemplary embodiments, since like reference numerals designate like elements having substantially the same configuration, a first exemplary embodiment may be representatively described, and in other exemplary embodiments, only a configuration different from the first exemplary embodiment may be described.

In addition, the size and thickness of each configuration shown in the drawings may be arbitrarily shown for understanding and ease of description, but the present invention is not limited thereto.

In the drawings, the thickness of layers, films, panels, regions, etc., may be exaggerated for clarity. In the drawings, for understanding and ease of description, the thickness of some layers and areas may be exaggerated. It will be understood that when an element such as a layer, film, region, or substrate is referred to as being "on" another element, it can be directly on the other element or intervening elements may also be present therebetween.

Further, unless explicitly described to the contrary, the word "comprise" and variations such as "comprises" or "comprising", will be understood to imply the inclusion of the stated elements but not the exclusion of any other elements. In addition, in the specification, the word "on" may mean positioning on or below the object portion, and does not necessarily mean positioning on the upper side of the object portion based on a gravity direction.

Hereinafter, referring to FIGS. 1A to 3, an organic light emitting diode display according to a first embodiment will be described.

FIG. 1A is a view illustrating an organic light emitting diode display according to a first embodiment.

As illustrated in FIG. 1A, an organic light emitting diode display 1000 according to the first embodiment includes a gate driver GD1, gate wires GW, a light emission control driver GD2, a data driver DD, data wires OW, and a pixel PE.

The gate driver GD1 corresponds to a control signal provided from an external control circuit not illustrated in the drawings, for example, a timing controller and the like, to sequentially provide scan signals to first scan lines SC1-SCn−1 and second scan lines SC2-SCn included in the gate wires GW. Then, the pixel PE is selected by a scan signal to sequentially receive a data signal.

The gate wires GW are positioned on the substrate SUB, and extend in a first direction. The gate wires GW include the first scan line SCn−1, light emission control lines E1-En, the second scan line SCn, an initialization power source line Vinit, and a fourth capacitor electrode CE4 as described below. The first scan line SCn−1 is coupled to the gate driver GD1, and receives a scan signal from the gate driver GD1. The light emission control line En is coupled to the light emission control driver GD2, and receives a light emission control signal from the light emission control driver GD2. The second scan line SCn is coupled to the gate driver GD1, and receives a scan signal from the gate driver GD1. The initialization power source line Vinit is coupled to the gate driver GD1, and receives initialization power from the gate driver GD1. The fourth capacitor electrode CE4 is spaced apart from the first scan line SCn−1 to extend in a first direction.

As described above, the initialization power source line Vinit, the first scan line SCn−1, the fourth capacitor electrode CE4, the second scan line SCn, and the light emission control line En may be spaced apart from each other to extend in a first direction. Further, the initialization power source line Vinit, the first scan line SCn−1, the fourth capacitor electrode CE4, the second scan line SCn, and the light emission control line En may be positioned on the same layer to be formed of substantially the same material, and may be formed through a process such as photolithography.

In the first exemplary embodiment, the initialization power source line Vinit receives initialization power from the gate driver GD1, but in another exemplary embodiment, the initialization power source line Vinit may be coupled to an additional other element (or constitution) to receive initialization power from the additional other element (or constitution).

The light emission control driver GD2 corresponds to a control signal provided from the outside, such as by a timing controller, to sequentially provide light emission control signals to the light emission control line En. Then, light emission of the pixel PE is controlled by the light emission control signal.

For example, the light emission control signal may control a light emission time of the pixel PE. However, the light emission control driver GD2 may be omitted according to an internal structure of the pixel PE.

The data driver DD corresponds to a control signal provided from the outside, such as by a timing controller, to provide a data signal to the data line DAm among the data wires DW. The data signal provided to the data line DAm is provided to the pixel PE selected by the scan signal whenever the scan signal is provided to the second scan line SCn. Then, the pixel PE charges a voltage corresponding to the data signal, and emits light having a luminance corresponding thereto.

The data wires DW may be positioned on the gate wires GW, and may extend in a second direction crossing the first direction. The data wires DW include data lines DA1-DAm and a driving power source line ELVDDL. The data line DAm is coupled to the data driver DD, and receives the data signal from the data driver DD. The driving power source line ELVDDL is coupled to an external first power source ELVDD as described below, and receives a driving power from the first power source ELVDD.

In one embodiment, the pixel PE is positioned in a cross region of the gate wires GW and the data wires DW, and includes the organic light emitting diode for emitting light having a luminance corresponding to a driving current corresponding to the data signal, a plurality of thin film transistors, and one or more capacitors for controlling the driving current flowing through the organic light emitting diode. The plurality of thin film transistors and one or more capacitors are each coupled to the gate wires GW and the data wires DW, and the organic light emitting diode is coupled to the plurality of thin film transistors and one or more capacitors. The organic light emitting diode is coupled between the first power source ELVDD and the second power source ELVSS.

Figure 2A:
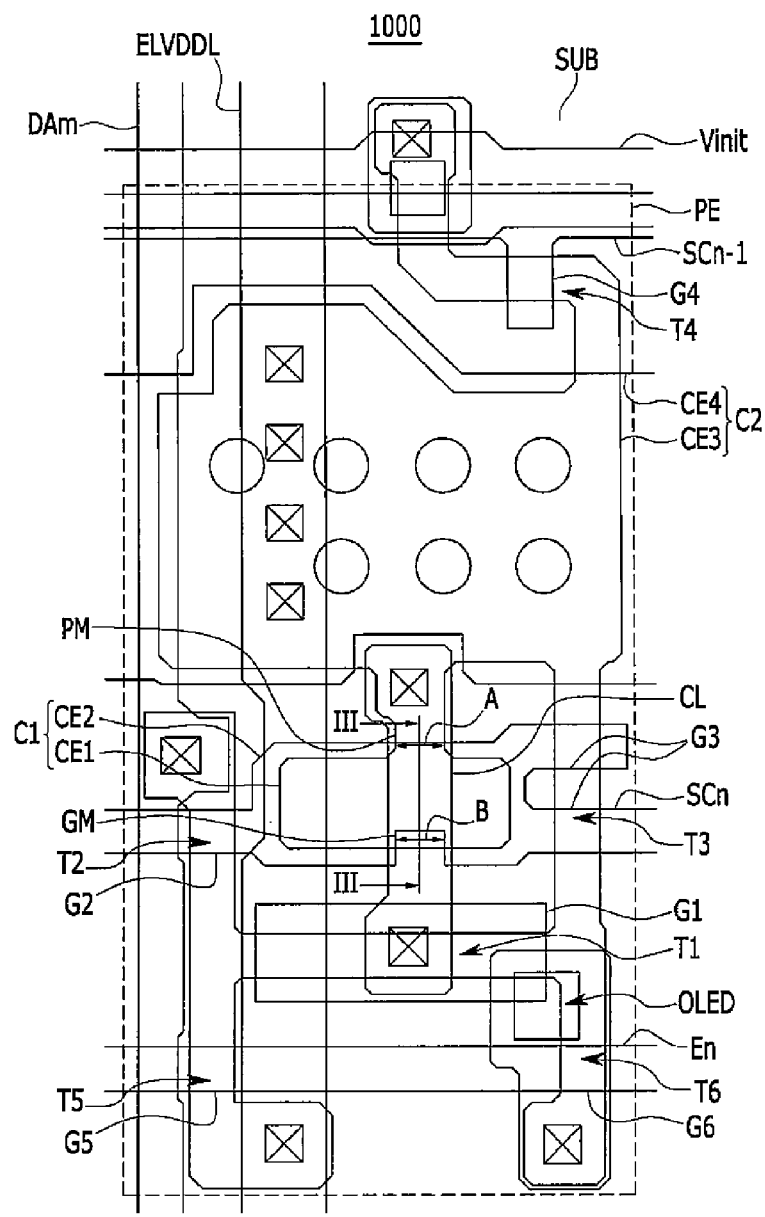
FIG. 2A is a layout view illustrating a pixel portion of the organic light emitting diode display illustrated in FIG. 1A.
Figure 2B:
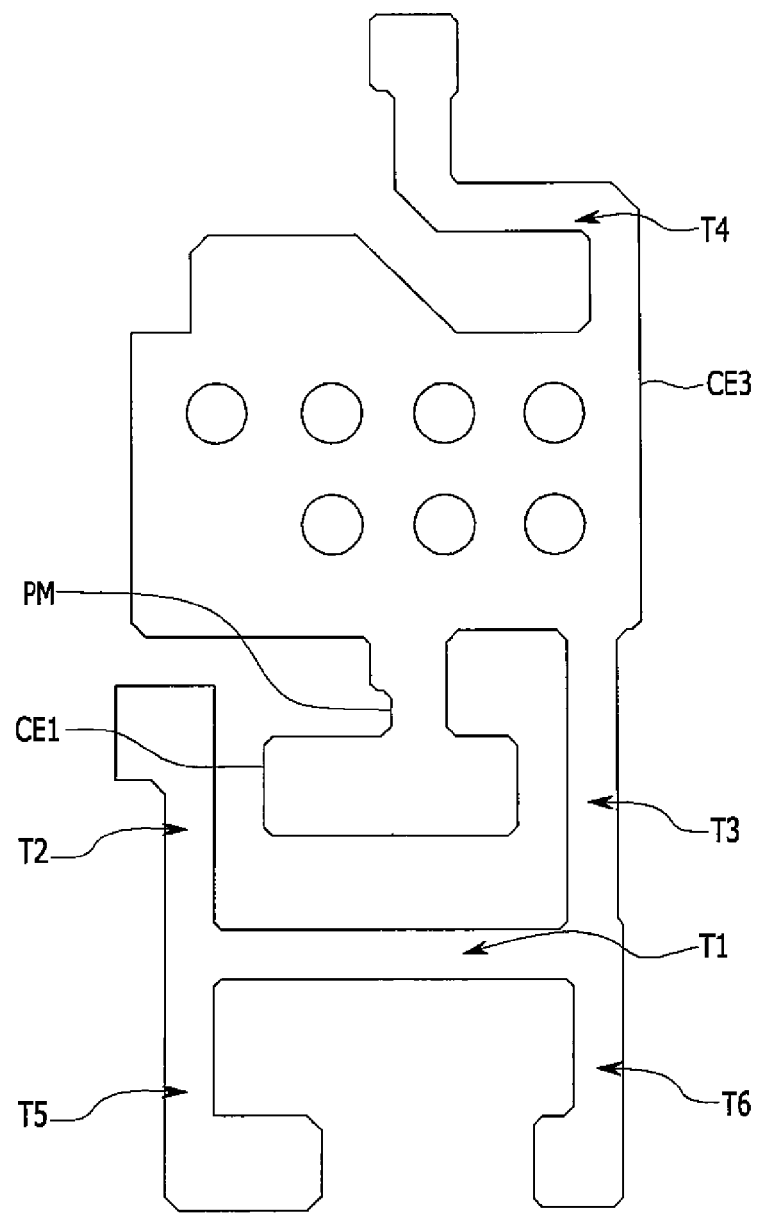
FIG. 2B is a top view of a layer of the pixel portion of FIG. 2A.
Figure 2C:
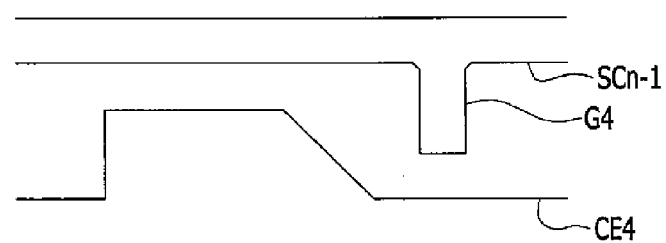
FIG. 2C is a top view of another layer of the pixel portion of FIG. 2A.
Figure 2C:
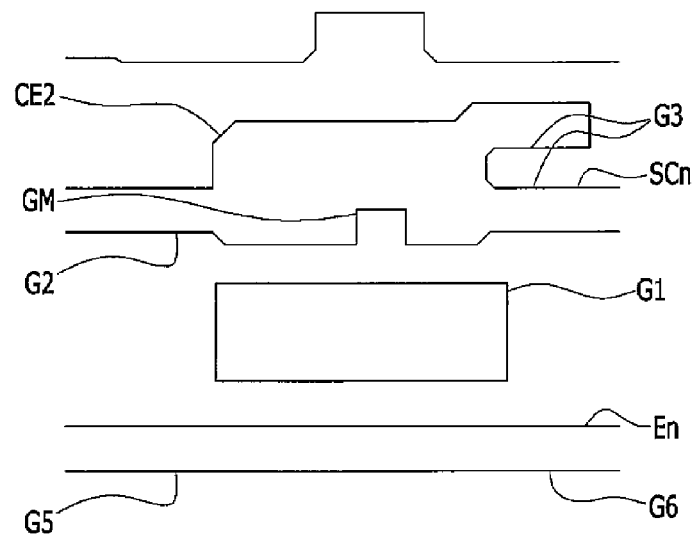
Figure 3:
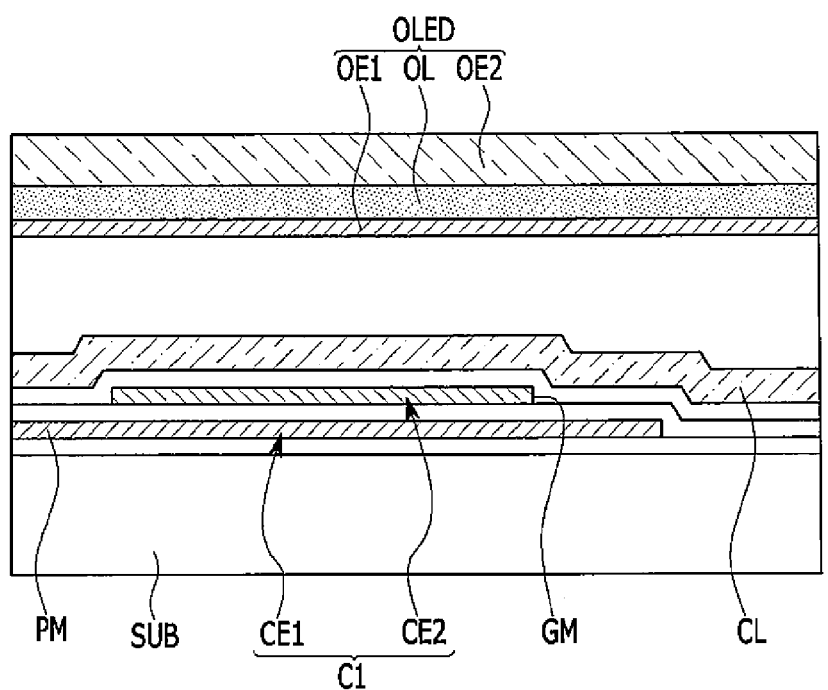
FIG. 3 is a cross-sectional view taken along the line III-III of FIG. 2A.

FIG. 2A is a layout view illustrating a pixel portion of the organic light emitting diode display illustrated in FIG. 1A. FIG. 2B is a top view of a layer of the pixel portion of FIG. 2A. FIG. 2C is a top view of another layer of the pixel portion of FIG. 2A. FIG. 3 is a cross-sectional view taken along the line III-III of FIG. 2A.

As illustrated in FIGS. 2A and 3, a pixel PE according to one embodiment includes the organic light emitting diode (OLED) coupled between the first power source ELVDD and the second power source ELVSS, and a pixel circuit including six thin film transistors and two capacitors coupled between the OLED and the first power source ELVDD to control a driving power provided to the OLED.

The OLED includes a first electrode OE1, an organic emission layer OL positioned on the first electrode OE1, and a second electrode OE2 positioned on the organic emission layer OL. The first electrode OE1 may be an anode of the OLED coupled to the driving power source line ELVDDL coupled through the pixel circuit to the first power source ELVDD, and the second electrode OE2 may be a cathode of the OLED coupled to the second power source ELVSS. The driving power may be provided from the first power source ELVDD through the pixel circuit to the organic emission layer OL of the OLED, and the organic emission layer emits light having a luminance corresponding to a driving current flowing through the OLED when a common power is provided from the second power source ELVSS.

According to one embodiment, the pixel circuit includes a first thin film transistor T1, a second thin film transistor T2, a third thin film transistor T3, a fourth thin film transistor T4, a fifth thin film transistor T5, a sixth thin film transistor T6, a first capacitor C1, and a second capacitor C2.

The first thin film transistor T1 is coupled between the driving power source line ELVDDL and the first electrode OE1 of the OLED, and provides a driving power corresponding to a data signal during a light emitting period of the pixel PE, from the first power source ELVDD to the OLED. The first thin film transistor T1 may therefore serve as a driving transistor of the pixel PE. The first gate electrode G1 of the first thin film transistor T1 is coupled through the connection line CL positioned on the same layer as the data wires DW to a third capacitor electrode CE3 of the second capacitor C2, a first capacitor electrode CE1 of the first capacitor C1, the third thin film transistor T3, and the fourth thin film transistor T4. A source electrode of the first thin film transistor T1 is coupled to the second thin film transistor T2 and the fifth thin film transistor T5, and a drain electrode of the first thin film transistor T1 is coupled to the third thin film transistor T3 and the sixth thin film transistor T6. The first electrode OE1 of the OLED is coupled through the sixth thin film transistor T6 to the first thin film transistor T1.

The active layer of the first thin film transistor T1 may be formed of substantially the same material as the second thin film transistor T2, the third thin film transistor T3, the fourth thin film transistor T4, the fifth thin film transistor T5, and the sixth thin film transistor T6, and may be formed on the same layer as the active layer of each thereof. Further, the active layer of the first thin film transistor T1 may be formed of substantially the same material as the first capacitor electrode CE1 of the first capacitor C1 and the third capacitor electrode CE3 of the second capacitor C2, and may be formed on the same layer as the electrodes. For example, the active layer of each of the first thin film transistor T1, the second thin film transistor T2, the third thin film transistor T3, the fourth thin film transistor T4, the fifth thin film transistor T5, and the sixth thin film transistor T6, the first capacitor electrode CE1 of the first capacitor C1, and the third capacitor electrode CE3 of the second capacitor C2 may be coupled to each other while having one pattern form.

The second thin film transistor T2 couples the data line DAm and the first thin film transistor T1, and includes a second gate electrode G2 coupled to the second scan line SCn. The second thin film transistor T2 transfers a data signal provided from the data line DAm into the pixel PE when a scan signal is provided from the second scan line SCn. The second thin film transistor T2 may therefore serve as a switching transistor of the pixel PE.

The third thin film transistor T3 couples the first thin film transistor T1 and the first gate electrode G1, and includes a third gate electrode G3 coupled to the second scan line SCn. The third capacitor electrode CE3 is positioned between the third thin film transistor T3 and the first gate electrode G1, and the third thin film transistor T3 is coupled through the connection line CL coupled to the third capacitor electrode CE3 to the first gate electrode G1. In one embodiment, the third thin film transistor T3 is diode-coupled to the first thin film transistor T1 when a data signal is provided into the pixel PE, thus compensating a threshold voltage of the first thin film transistor T1. The third thin film transistor T3 may therefore serve as a compensation transistor of the pixel PE.

The fourth thin film transistor T4 couples the initialization power source line Vinit and the first gate electrode G1 of the first thin film transistor T1, and includes a fourth gate electrode G4 coupled to the first scan line SCn−1. The third capacitor electrode CE3 is positioned between the fourth thin film transistor T4 and the first gate electrode G1, and the fourth thin film transistor T4 is coupled through the connection line CL coupled to the third capacitor electrode CE3 to the first gate electrode G1. The fourth thin film transistor T4 transfers the initialization power provided from the initialization power source line Vinit into the pixel PE to initialize the first thin film transistor T1 so that the data signal may be more smoothly provided into the pixel PE during a data programming period. The data signal is inputted to the pixel PE when the scan signal is provided from the first scan line SCn−1 during an initialization period prior to the data programming period. The fourth thin film transistor T4 may therefore serve as a switching transistor of the pixel PE.

The fifth thin film transistor T5 couples the driving power source line ELVDDL and the first thin film transistor T1, and includes a fifth gate electrode G5 coupled to the light emission control line En. The fifth thin film transistor T5 may block connection between the driving power source line ELVDDL coupled to the first power source ELVDD and the first thin film transistor T1 during a non-light emitting period of the pixel PE, and may couple the driving power source line ELVDDL and the first thin film transistor T1 during a light emitting period of the pixel PE. The fifth thin film transistor T5 may therefore serve as a switching transistor of the pixel PE.

The sixth thin film transistor T6 couples the first thin film transistor T1 and the first electrode OE1 of the OLED, and includes a sixth gate electrode G6 coupled to the light emission control line En. The sixth thin film transistor T6 may block connection between the first thin film transistor T1 and the OLED during the non-light emitting period of the pixel PE, and may couples the first thin film transistor T1 and the OLED during the light emitting period of the pixel PE. The sixth thin film transistor T6 may therefore serve as a switching transistor of the pixel PE.

Further, the first gate electrode G1, the second gate electrode G2, the third gate electrode G3, the fourth gate electrode G4, the fifth gate electrode G5 and the sixth gate electrode G6 may be positioned on the same layer, and may be formed at substantially the same time as the gate wires GW by using a process such as photolithography for forming the gate wires GW.

The second capacitor C2 may store a data signal provided into the pixel PE during the data programming period and may maintain the data signal during one frame. In one embodiment, the second capacitor C2 is formed between the driving power source line ELVDDL coupled to the first power source ELVDD and the first gate electrode G1 of the first thin film transistor T1 coupled to the initialization power source line Vinit. The second capacitor C2 may therefore serve as a storage capacitor.

The second capacitor C2 may include a third capacitor electrode CE3 and a fourth capacitor electrode CE4 positioned on the substrate SUB and facing each other with an insulation layer interposed therebetween.

The third capacitor electrode CE3 may be coupled through the fourth thin film transistor T4 to the initialization power source line Vinit, and may be positioned on the same layer as the active layer of each of the first thin film transistor T1 to the sixth thin film transistor T6. The third capacitor electrode CE3 may be coupled through the connection line CL to the first gate electrode G1 of the first thin film transistor T1.

The fourth capacitor electrode CE4 may be coupled to the driving power source line ELVDDL, and may be positioned on the same layer as the gate wires GW, and the first gate electrode G1 of the first thin film transistor T1 to the sixth gate electrode G6 of the sixth thin film transistor T6. The fourth capacitor electrode CE4, as illustrated in FIG. 1A, may cross an adjacent pixel PE to extend in a first direction.

The first capacitor C1 may compensate a voltage drop due to a load in the organic light emitting diode display 1000, and may be formed between the third capacitor electrode CE3 of the second capacitor C2 and the second scan line SCn. For example, when a voltage level of a current scan signal is changed, particularly, when provision of the current scan signal is stopped, the first capacitor C1 increases a voltage of the first gate electrode G1 of the first thin film transistor T1 due to a coupling function, to serve as a boosting capacitor compensating a voltage drop due to a load in the organic light emitting diode display 1000.

The first capacitor C1 may include the first capacitor electrode CE1 and the second capacitor electrode CE2.

The first capacitor electrode CE1 may be on the second capacitor electrode CE2, and may be coupled to the first gate electrode G1 of the first thin film transistor T1 through the connection line CL, which extends along the same imaginary line in a second direction. The first capacitor electrode CE1 may have a form extending from the third capacitor electrode CE3, and may be positioned on the same layer as the active layer of each of the first thin film transistor T1 to the sixth thin film transistor T6. In one embodiment, the first capacitor electrode CE1 includes a protruding portion PM directly coupled to the third capacitor electrode CE3, and the first capacitor electrode CE1 is coupled through the third capacitor electrode CE3 to the initialization power source line Vinit. The protruding portion PM of the first capacitor electrode CE1 does not overlap the second capacitor electrode CE2. The protruding portion PM protrudes in a plate surface direction (e.g., the second direction) of the substrate SUB to couple the third capacitor electrode CE3 and the first capacitor electrode CE1.

The second capacitor electrode CE2 may be coupled to the second scan line SCn, and may be positioned on the first capacitor electrode CE1 with the insulation layer interposed therebetween. The second capacitor electrode CE2 may be positioned on the same layer as the gate wires GW and the first gate electrode G1 of the first thin film transistor T1 to the sixth gate electrode G6 of the sixth thin film transistor T6. The second capacitor electrode CE2 may include a recess portion GM through which the first capacitor electrode CE1 is exposed.

Herein, exposure means direct or indirect exposure, and means that the first capacitor electrode CE1 is directly exposed or indirectly exposed by the recess portion GM. For example, the insulation layer covering the first capacitor electrode CE1 may be exposed by the recess portion GM.

The recess portion GM and the protruding portion PM may be positioned along the same imaginary line, and the connection line CL may be positioned along the same imaginary line.

The recess portion GM may be recessed in a plate surface direction (e.g., the second direction) of the substrate SUB, and a width B of the recess portion GM and a width A of the protruding portion PM may be substantially the same as each other. When the width B of the recess portion GM and the width A of the protruding portion PM are substantially the same as each other, even though a process deviation may occur during a manufacturing process of forming the first capacitor C1, the process deviation occurring in the first capacitor C1 may be compensated by the protruding portion PM and the recess portion GM of each of the first capacitor electrode CE 1 and the second capacitor electrode CE2.

As described above, in one embodiment, while the first capacitor electrode CE1 of the first capacitor C1 includes the protruding portion PM coupled to the third capacitor electrode CE3, the second capacitor electrode CE2 includes the recess portion GM having substantially the same width B as the width A of the protruding portion PM, and thus, an area of the first capacitor C1 is not increased. Accordingly, an area constituting one pixel is not increased by the first capacitor C1 and a load of a current through the first capacitor C1 is not increased.

Hereinafter, operation of a pixel PE according to an embodiment will be described.

First, a prior scan signal at a low level is provided through the first scan line SCn−1 during a first period that is set as an initialization period. Then, the fourth thin film transistor T4 is turned on corresponding to the prior scan signal at the low level. The initialization power is provided from the initialization power source line Vinit through the fourth thin film transistor T4 to the first thin film transistor T1, to initialize the first thin film transistor T1.

Thereafter, a current scan signal at a low level is provided through the second scan line SCn during a second period that is set as a data programming period. Then, the second thin film transistor T2 and the third thin film transistor T3 are turned on corresponding to the current scan signal at the low level.

In addition, the first thin film transistor T1 is turned-on in a diode-coupled form by the third thin film transistor T3, and since the first thin film transistor T1 is initialized during the aforementioned first period, the first thin film transistor T1 is diode-coupled in a forward direction.

Thereby, the data signal provided from the data line DAm is provided via the second thin film transistor T2, the first thin film transistor T1, and the third thin film transistor T3, and thus a voltage corresponding to a difference between the data signal and the threshold voltage of the first thin film transistor T1 is stored in the second capacitor C2.

Thereafter, if the voltage level of the current scan signal is changed to a high level while provision of the current scan signal is stopped, the voltage applied to the first gate electrode G1 of the first thin film transistor T1 is changed corresponding to a voltage change magnitude of the current scan signal, due to a coupling function of the first capacitor C1. In this case, since the voltage applied to the first gate electrode G1 of the first thin film transistor T1 is changed by charge sharing between the first capacitor C1 and the second capacitor C2, a quantity of voltage applied to the first gate electrode G1 is changed in proportion to a charge sharing value between the first capacitor C1 and the second capacitor C2 together with a change in magnitude (or quantity) of voltage of the current scan signal.

Thereafter, a light emission control signal provided from the light emission control line En during a third period that is set as the light emitting period is changed from a high level to a low level. Then, the fifth thin film transistor T5 and the sixth thin film transistor T6 are turned on by the light emission control signal at the low level during the third period. Thereby, a driving current is provided in a path from the first power source ELVDD through the driving power source line ELVDDL, the fifth thin film transistor T5, the first thin film transistor T1, the sixth thin film transistor T6, and the OLED, to the second power source ELVSS.

The driving current is controlled by the first thin film transistor T1, and the first thin film transistor T1 generates a driving current having a magnitude corresponding to the voltage provided to the first gate electrode G1 thereof. According to an embodiment, since a voltage reflecting the threshold voltage of the first thin film transistor T1 is stored in the second capacitor C2 during the aforementioned second period, the threshold voltage of the first thin film transistor T1 may be compensated during the third period.

As described above, in the organic light emitting diode display 1000 according to the first exemplary embodiment, even though the first capacitor electrode CE1 of the first capacitor C1 includes the protruding portion PM coupled to the third capacitor electrode CE3, the second capacitor electrode CE2 of the first capacitor C1 includes the recess portion GM having substantially the same width B as the width A of the protruding portion PM, and thus the area of the first capacitor C1 is not increased, such that the area constituting one pixel is not increased by the first capacitor C1 and the load of the current through the first capacitor C1 is not increased. Thereby, many pixels may be formed in an area (e.g., an initially set area), and the load of the current through the pixels is not increased. Accordingly, an optimized organic light emitting diode display 1000 having improved (or high) resolution may be provided.

Further, in the organic light emitting diode display 1000 according to the first exemplary embodiment, since the width B of the recess portion GM of the second capacitor electrode CE2 and the width A of the protruding portion PM of the first capacitor electrode CE1 are substantially the same as each other, even though a process deviation may occur during a manufacturing process of forming the first capacitor C1, the process deviation occurring in the first capacitor C1 may be compensated by the protruding portion PM of the first capacitor electrode CE1 and the recess portion GM of the second capacitor electrode CE2. That is, even though a process deviation may occur, the organic light emitting diode display 1000 including the first capacitor C1 for storing a set voltage may be provided.

Hereinafter, an organic light emitting diode display according to a second exemplary embodiment will be described with reference to FIG. 4.

Hereinafter, only specific portions that are different from those of the first exemplary embodiment may be described, and an omitted portion of description thereof depends on the first exemplary embodiment. In addition, in the second exemplary embodiment, for better comprehension and ease of description, the same constituent elements are designated by the same reference numerals as for the first exemplary embodiment.

Figure 4:
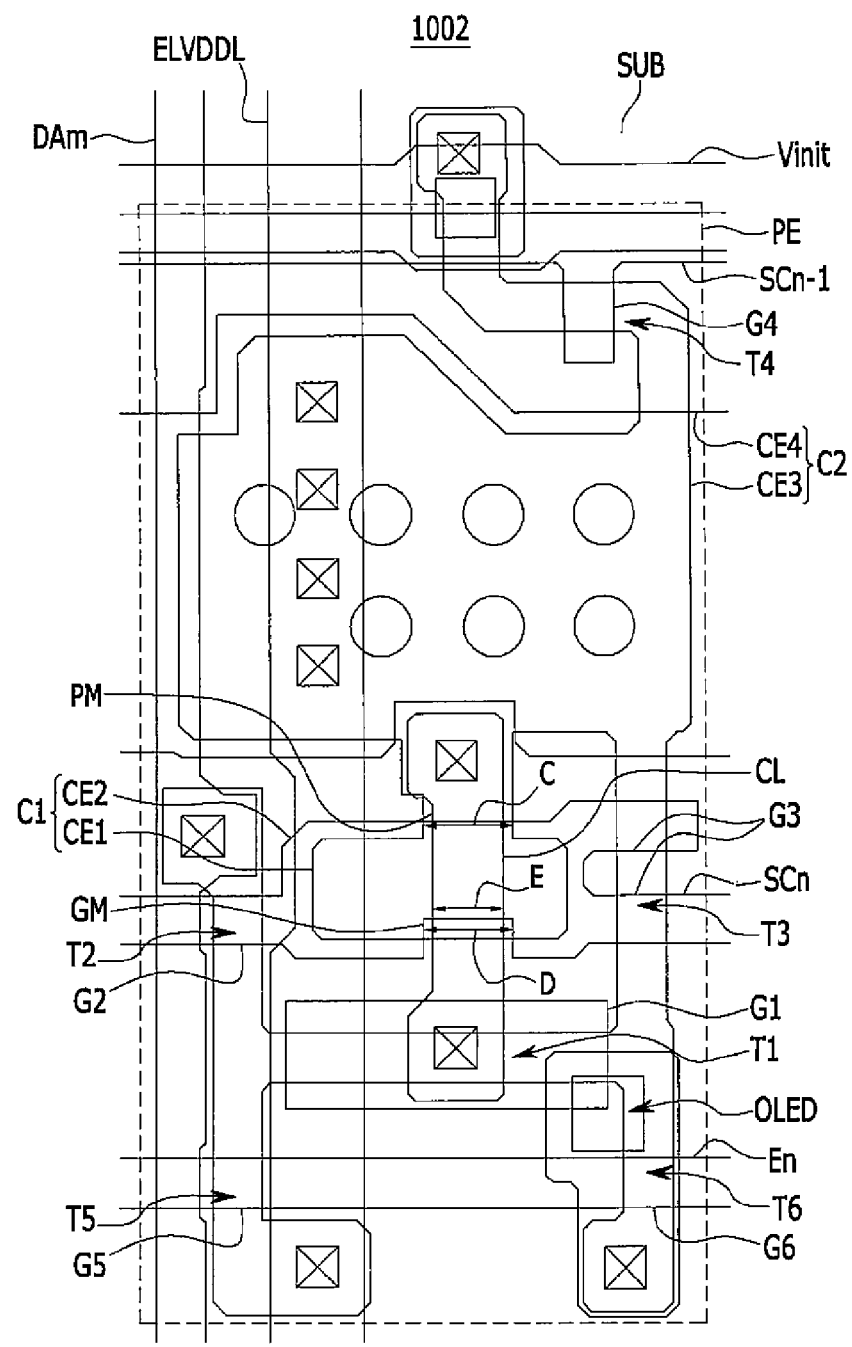
FIG. 4 is a layout view illustrating a pixel portion of an organic light emitting diode display according to a second embodiment.

FIG. 4 is a layout view illustrating a pixel portion of an organic light emitting diode display according to the second exemplary embodiment.

As illustrated in FIG. 4, in an organic light emitting diode display 1002 according to the second exemplary embodiment, the first capacitor electrode CE1 of the first capacitor C1 includes the protruding portion PM, and the second capacitor electrode CE2 includes the recess portion GM.

The protruding portion PM and the recess portion GM extend along the same imaginary line to be arranged corresponding to the connection line CL coupling the first gate electrode G1 and the first capacitor electrode CE1. A width D of the recess portion GM is larger than a width E of the connection line CL, and the width C of the protruding portion PM is substantially the same as the width D of the recess portion GM. The width D of the recess portion GM may be larger than the width E of the connection line CL by 2 μm or more.

As described above, in the organic light emitting diode display 1002 according to the second exemplary embodiment, even though the first capacitor electrode CE1 of the first capacitor C1 includes the protruding portion PM coupled to the third capacitor electrode CE3, the second capacitor electrode CE2 includes the recess portion GM having substantially the same width D as the width C of the protruding portion PM, and thus the area of the first capacitor C1 is not increased, such that the area constituting one pixel is not increased by the first capacitor C1 and the load of the current through the first capacitor C1 is not increased. Thereby, many pixels may be formed in an area (e.g., an initially set area), and the load of the current through the pixels is not increased. Accordingly, an optimized organic light emitting diode display 1002 having improved (or high) resolution may be provided.

Further, in the organic light emitting diode display 1002 according to the second exemplary embodiment, since the width D of the recess portion GM is larger than the width E of the connection line CL, an undesired capacity may be prevented from being formed between the second capacitor electrode CE2 positioned on the same layer as the gate wires GW, and the connection line CL positioned on the same layer as the data wires DW at a position corresponding to the recess portion GM. Thereby, an undesired increase in load of a current may be prevented between the second capacitor electrode CE2 and the connection line CL at the position corresponding to the recess portion GM.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims and their equivalents.

DESCRIPTION OF SOME OF THE REFERENCE NUMERALS

SUB: substrate
OLED: organic light emitting diode
T1: first thin film transistor
CE1: first capacitor electrode
CE2: second capacitor electrode
C1: first capacitor
PM: protruding portion
GM: recess portion

What is claimed is:

1. An organic light emitting diode display comprising:
a substrate;
an organic light emitting diode on the substrate;
a first thin film transistor comprising a drain electrode coupled to a first electrode of the organic light emitting diode; and
a first capacitor comprising a first capacitor electrode coupled to a first gate electrode of the first thin film transistor and a second capacitor electrode on the first capacitor electrode,
wherein the first capacitor electrode comprises a protruding portion not overlapping the second capacitor electrode, and the second capacitor electrode comprises a recess portion through which the first capacitor electrode is exposed, the recess portion being surrounded on at least three sides by edges of the second capacitor electrode, and
wherein a width of the protruding portion and a width of the recess portion are substantially the same as each other.

2. The organic light emitting diode display of claim 1, wherein:
the protruding portion protrudes in a second direction of the substrate, and the recess portion is recessed in the second direction of the substrate.

3. The organic light emitting diode display of claim 1, wherein:
the protruding portion and the recess portion extend in a second direction of the substrate.

4. The organic light emitting diode display of claim 3, further comprising:
a connection line extending along the second direction and on the second capacitor electrode to couple the first gate electrode and the first capacitor electrode,
wherein the width of the recess portion is larger than a width of the connection line.

5. The organic light emitting diode display of claim 1, further comprising:
a first scan line extending in a first direction on the substrate;
a second scan line extending in the first direction to be spaced apart from the first scan line and coupled to the second capacitor electrode;
an initialization power source line extending in the first direction to be spaced apart from the second scan line and coupled to the first capacitor electrode;
a light emission control line extending in the first direction to be spaced apart from the initialization power source line;
a data line extending in a second direction crossing the first direction on the substrate; and
a driving power source line extending in the second direction to be spaced apart from the data line.

6. The organic light emitting diode display of claim 5, wherein:
the second capacitor electrode, the first gate electrode, the first scan line, the second scan line, and the light emission control line are on the same layer.

7. The organic light emitting diode display of claim 5, further comprising:
a second thin film transistor comprising a second gate electrode coupled to the second scan line and coupling the data line and the first thin film transistor;
a third thin film transistor comprising a third gate electrode coupled to the second scan line and coupling the first thin film transistor and the first gate electrode of the first thin film transistor;
a fourth thin film transistor comprising a fourth gate electrode coupled to the first scan line and coupling the initialization power source line and the first gate electrode;
a fifth thin film transistor comprising a fifth gate electrode coupled to the light emission control line and coupling the driving power source line and the first thin film transistor; and
a sixth thin film transistor comprising a sixth gate electrode coupled to the light emission control line and coupling the first thin film transistor and the organic light emitting diode.

8. The organic light emitting diode display of claim 7, wherein:
the first gate electrode, the second gate electrode, the third gate electrode, the fourth gate electrode, the fifth gate electrode, and the sixth gate electrode are on the same layer as the second capacitor electrode, and
an active layer of each of the first thin film transistor, the second thin film transistor, the third thin film transistor, the fourth thin film transistor, the fifth thin film transistor, and the sixth thin film transistor is on the same layer as the first capacitor electrode.

9. The organic light emitting diode display of claim 8, further comprising:
a second capacitor comprising a third capacitor electrode between the active layer of the fourth thin film transistor and the first capacitor electrode to be coupled to the first capacitor electrode, and a fourth capacitor electrode coupled to the driving power source line and on the same layer as the first gate electrode.

10. The organic light emitting diode display of claim 9, wherein:
the protruding portion couples the third capacitor electrode and the first capacitor electrode.

11. The organic light emitting diode display of claim 1, wherein the organic light emitting diode comprises:
the first electrode coupled to the first thin film transistor;
an organic emission layer on the first electrode; and
a second electrode on the organic emission layer.

* * * * *